(12) United States Patent
Yabe et al.

(10) Patent No.: US 9,425,071 B2
(45) Date of Patent: Aug. 23, 2016

(54) FILM FORMING METHOD

(71) Applicants: TOKYO ELECTRON LIMITED, Tokyo (JP); IWATANI CORPORATION, Osaka-shi, Osaka (JP)

(72) Inventors: Kazuo Yabe, Nirasaki (JP); Akira Shimizu, Nirasaki (JP); Koichi Izumi, Amagasaki (JP); Masahiro Furutani, Amagasaki (JP)

(73) Assignees: TOKYO ELECTRON LIMITED, Tokyo (JP); IWATANI CORPORATION, Osaka (JP)

( * ) Notice: Subject to any disclaimer, the term of this patent is extended or adjusted under 35 U.S.C. 154(b) by 0 days.

(21) Appl. No.: 14/698,273

(22) Filed: Apr. 28, 2015

(65) Prior Publication Data

US 2015/0318170 A1 Nov. 5, 2015

(30) Foreign Application Priority Data

Apr. 30, 2014 (JP) ................................. 2014-093799

(51) Int. Cl.
*H01L 21/02* (2006.01)
*H01L 21/67* (2006.01)
*C23C 16/40* (2006.01)
*C23C 16/455* (2006.01)

(52) U.S. Cl.
CPC ........ *H01L 21/67017* (2013.01); *C23C 16/402* (2013.01); *C23C 16/45534* (2013.01); *H01L 21/022* (2013.01); *H01L 21/02164* (2013.01); *H01L 21/02236* (2013.01)

(58) Field of Classification Search
CPC .................. H01L 21/02236; H01L 21/02164; H01L 21/022; H01L 29/7869; H01L 21/02554; H01L 21/02631; H01L 29/78603; H01L 29/78693; H01L 21/02488; H01L 21/441; H01L 29/518; H01L 21/02126; H01L 21/02211; H01L 21/02252; H01L 21/02255; H01L 21/32105; H01L 21/32136; H01L 29/517
USPC ........................................................ 438/770
See application file for complete search history.

(56) References Cited

U.S. PATENT DOCUMENTS

2011/0028002 A1* 2/2011 Hirota ................... C23C 16/405
438/761

FOREIGN PATENT DOCUMENTS

JP 2007-251071 A 9/2007
JP 2013-197421 A 9/2013

\* cited by examiner

*Primary Examiner* — Caleen Sullivan
(74) *Attorney, Agent, or Firm* — Nath, Goldberg & Meyer; Jerald L. Meyer

(57) ABSTRACT

A film forming method for obtaining a thin film by laminating molecular layers of oxide on a surface of a substrate in a vacuum atmosphere includes performing a cycle a plurality of times. The cycle includes: supplying a source gas containing a source to the substrate in a vacuum vessel to adsorb the source onto the substrate; forming an ozone atmosphere containing ozone having a concentration not less than that where a chain decomposition reaction is caused in the vacuum vessel; and forcibly decomposing the ozone by supplying energy to the ozone atmosphere to generate active species of oxygen, and oxidizing the source adsorbed onto the surface of the substrate by the active species to obtain the oxide.

4 Claims, 15 Drawing Sheets

US 9,425,071 B2

FILM FORMING METHOD

CROSS-REFERENCE TO RELATED APPLICATION

This application claims the benefit of Japanese Patent Application No. 2014-093799, filed on Apr. 30, 2014, in the Japan Patent Office, the disclosure of which is incorporated herein in its entirety by reference.

TECHNICAL FIELD

The present disclosure relates to a film forming method for forming an oxide film on a substrate in a vacuum atmosphere.

BACKGROUND

In a manufacturing process of a semiconductor device, in some cases, a process of oxidizing a surface of a semiconductor wafer (hereinafter, referred to as a "wafer") that is a substrate is performed.

Meanwhile, an ALD (Atomic Layer Deposition) method is known as the process in which the oxidation is performed. In some cases, a process of forming a thin film such as silicon oxide ($SiO_2$) on a surface of a wafer using the ALD method is performed. In a film forming apparatus for performing the ALD method, a mounting unit of a wafer is installed in a processing vessel (vacuum vessel) of which the interior is set to a vacuum atmosphere. Then, the supply of a source gas containing a source of silicon to the mounted wafer and the oxidation of the source adsorbed onto the wafer are alternately repeated a plurality of times.

The oxidation of the source has been performed by supplying an oxidation gas such as oxygen or ozone to the substrate, by supplying hydrogen and oxygen to the substrate to generate oxygen radicals, or by generating plasma by oxygen in a vacuum vessel. However, when the oxidation gas is supplied, it is necessary to heat the wafer at a relatively high temperature in order to allow the oxidation gas to chemically react with the source. When the oxygen radicals are generated, it is also necessary to heat the wafer at a relatively high temperature in order to generate the radicals. When the oxygen plasma is used, although components of the source gas deposited on the wafer can be oxidized even at room temperature, there is a difference in film quality between a planar portion and a side portion of a pattern of the wafer due to the straightability of plasma active species consisting of ions or electrons. Thus, the film quality of the side portion is degraded as compared with that of the planar portion. For this reason, the adaptation to a fine pattern is difficult.

Therefore, a heating mechanism such as a heater is conventionally installed in a film forming apparatus. However, the heating mechanism installation as described above increases the manufacturing cost or operating cost of the apparatus, and the oxidation of the source cannot be performed until the wafer is loaded into a vacuum vessel and then heated to reach a predetermined temperature. Hence, it is difficult to promote reduction in processing time. However, in the related art, a technique applied to the above-described ALD method is not described. Also, in the related art, oxygen gas, nitrogen gas and hydrogen gas are supplied and mixed in a reduced pressure atmosphere to generate reactive species (atomic oxygen). However, since in order to generate the atomic oxygen, the temperature of an atmosphere where each gas is supplied becomes 400 degrees C. to 1200 degrees C. by the heater, the above-described problem cannot be solved.

SUMMARY

Some embodiments of the present disclosure provide a technique in which when an oxide film is formed on a substrate by repeatedly performing a cycle including adsorption of a source on the substrate and oxidation of the source, the oxidation is sufficiently performed without using a heating mechanism for heating the substrate, thereby obtaining an oxide film having excellent properties.

According to one embodiment of the present disclosure, there is provided a film forming method for obtaining a thin film by laminating molecular layers of oxide on a surface of a substrate in a vacuum atmosphere, the method including performing a cycle a plurality of times, the cycle including: supplying a source gas containing a source to the substrate in a vacuum vessel to adsorb the source onto the substrate; forming an ozone atmosphere containing ozone having a concentration not less than that where a chain decomposition reaction is caused in the vacuum vessel; and forcibly decomposing the ozone by supplying energy to the ozone atmosphere to generate active species of oxygen, and oxidizing the source adsorbed onto the surface of the substrate by the active species to obtain the oxide.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
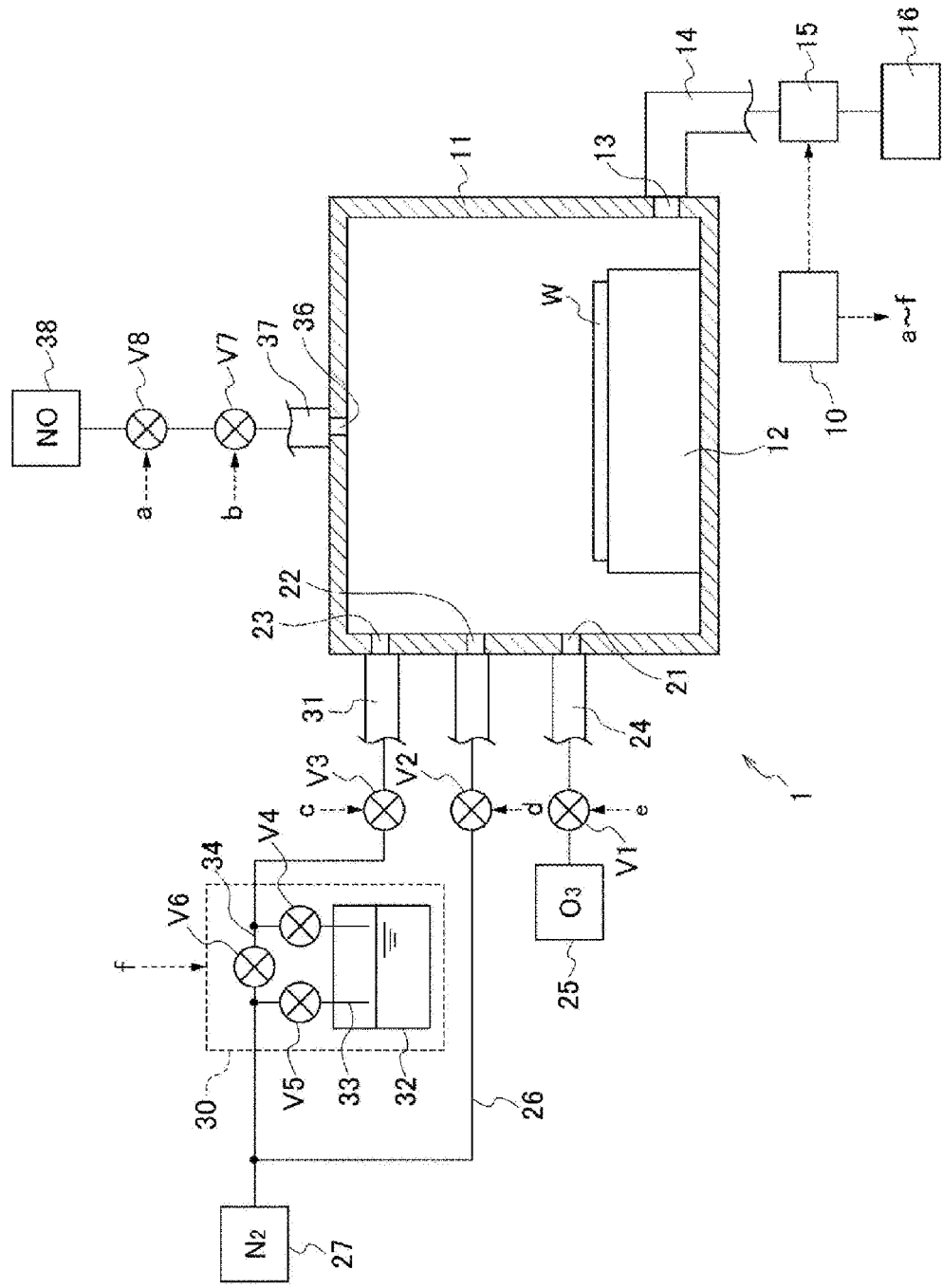
FIG. 1 is a longitudinal sectional side view of a film forming apparatus for performing a film forming method of the present disclosure.

A film forming apparatus 1 for performing a film forming method of the present disclosure will be described with reference to a longitudinal sectional side view of FIG. 1. The film forming apparatus 1 forms a silicon oxide film on a wafer W that is a substrate through an ALD method. In the figure, reference numeral 11 designates a vacuum vessel (processing vessel) in which a vacuum atmosphere may be formed. A processing space in the vacuum vessel 11 is at a temperature where heating and cooling are not performed from the exterior of the processing space, i.e., room temperature. Further, each reaction described later is performed at room temperature. In the figure, reference numeral 12 designates a stage on which the wafer W is horizontally mounted. In the figure, reference numeral 13 designates an exhaust port, which is opened, for example, at a lower portion of a sidewall of the vacuum vessel 11. In the figure, reference numeral 14 designates an exhaust pipe having one end connected to the exhaust port 13. The other end of the exhaust pipe 14 is connected to an exhaust mechanism 16 through an exhaust flow rate adjustment unit 15. The exhaust mechanism 16 is configured by, for example, a vacuum pump. The exhaust flow rate adjustment unit 15 includes, for example, a valve, and may adjust an exhaust flow rate from the exhaust port 13. With this configuration, the interior of the vacuum vessel 11 can be maintained under a vacuum atmosphere of desired pressure.

Gas supply ports 21, 22 and 23 are opened in a sidewall of the vacuum vessel 11. One end of a pipe 24 is connected to the gas supply port 21, and the other end of the pipe 24 is connected to an $O_3$ (ozone) gas supply source 25 through a valve V1. The $O_3$ gas supply source 25 may supply the pipe 24, for example, with $O_3$ gas at a ratio of ozone to oxygen of 8 to 100 Vol %. One end of a pipe 26 is connected to the gas supply port 22, and the other end of the pipe 26 is connected to a $N_2$ (nitrogen) gas supply source 27 through a valve V2.

One end of a pipe 31 is connected to the gas supply port 23, and the other end of the pipe 31 is connected through valves V3 and V4 to a liquid source tank 32 in this order. Liquid aminosilane that is a film forming source of $SiO_2$ (silicon oxide) is stored in the liquid source tank 32, and the pipe 31 is opened at a gas space portion of the liquid source tank 32. As the aminosilane, any one may be used as long as it is formed into a silicon oxide film through oxidation. In this example, BTBAS (bis(tertiary-butylamino-silane)) is stored. One end of a pipe 33 is opened at the gas space portion of the liquid source tank 32, and the other end of the pipe 33 is connected to an upstream side of the valve V2 of the pipe 26 through a valve V5. In the figure, reference numeral 34 designates a pipe, one end of which is connected between the valves V3 and V4 of the pipe 31. The other end of the pipe 34 is connected to an upstream side of the valve V5 of the pipe 33. A valve V6 is installed in the pipe 34.

With this configuration, the $N_2$ gas of the $N_2$ (nitrogen) gas supply source 27 is supplied, as a carrier gas, to the liquid source tank 32 and vaporizes the aminosilane in the tank 32. Then, a mixture gas of the vaporized aminosilane and the $N_2$ gas is supplied to the wafer W in the vacuum vessel 11. The vaporized aminosilane is the film forming source. In some cases, the mixture gas including the carrier gas may be represented as a film forming source gas. In the figure, the valves V4 to V6 and the liquid source tank 32 are represented as a source supply unit 30.

A gas supply port 36 is opened in the ceiling portion of the vacuum vessel 11 to face the wafer W mounted on the stage 12. One end of a pipe 37 is connected to the gas supply port 36, and the other end of the pipe 37 is connected through valves V7 and V8 to an NO (nitrogen monoxide) gas supply source 38 in this order. As will be described later, a portion between the valves V7 and V8 of the pipe 37 corresponds to a gas storage portion which temporarily stores NO gas when the NO gas is supplied to the interior of the vacuum vessel 11 from the gas supply port 36.

The film forming apparatus 1 has a control unit 10, and the control unit 10 consists of, for example, a computer having a CPU (not shown) and a memory unit (not shown). The control unit 10 transmits a control signal to each unit of the film forming apparatus 1 to control each operation such as the opening/closing of each valve V or an exhaust flow rate adjustment by the exhaust flow rate adjustment unit 15. In order to output the control signal, a program that incorporates a step (command) group is stored in the memory unit. The program may be stored in, for example, a recording medium such as a hard disk, a compact disk, a magneto-optical disk, or a memory card, to be installed in the computer from the recording medium.

Figure 2:
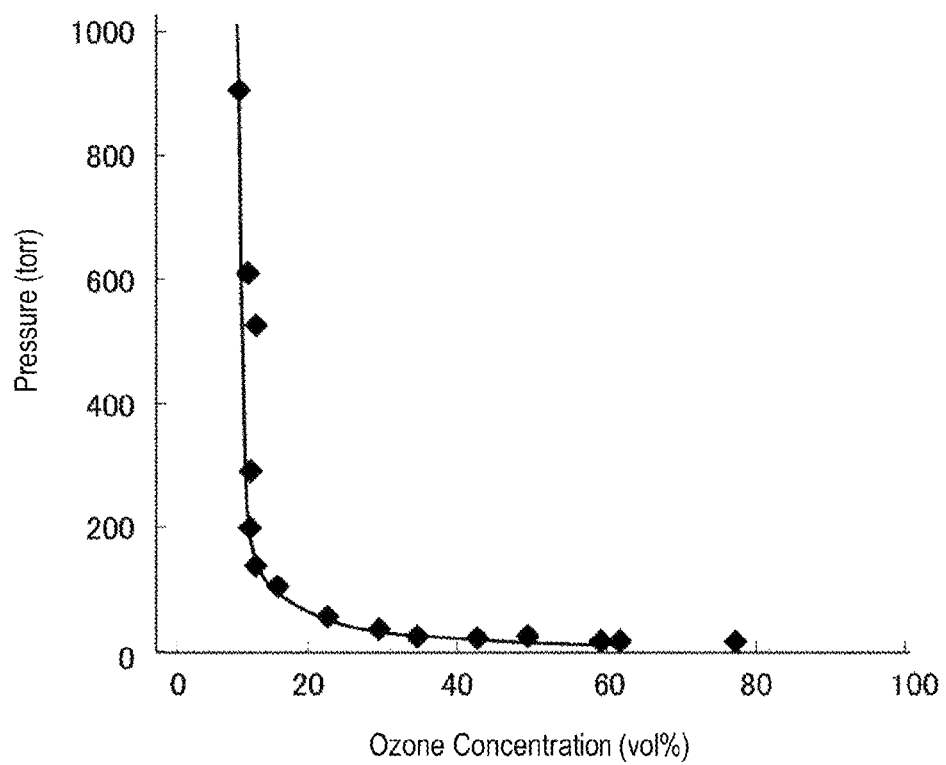
FIG. 2 is a graph illustrating a threshold pressure and a threshold concentration of ozone for causing a forced decomposition.
Figure 3:
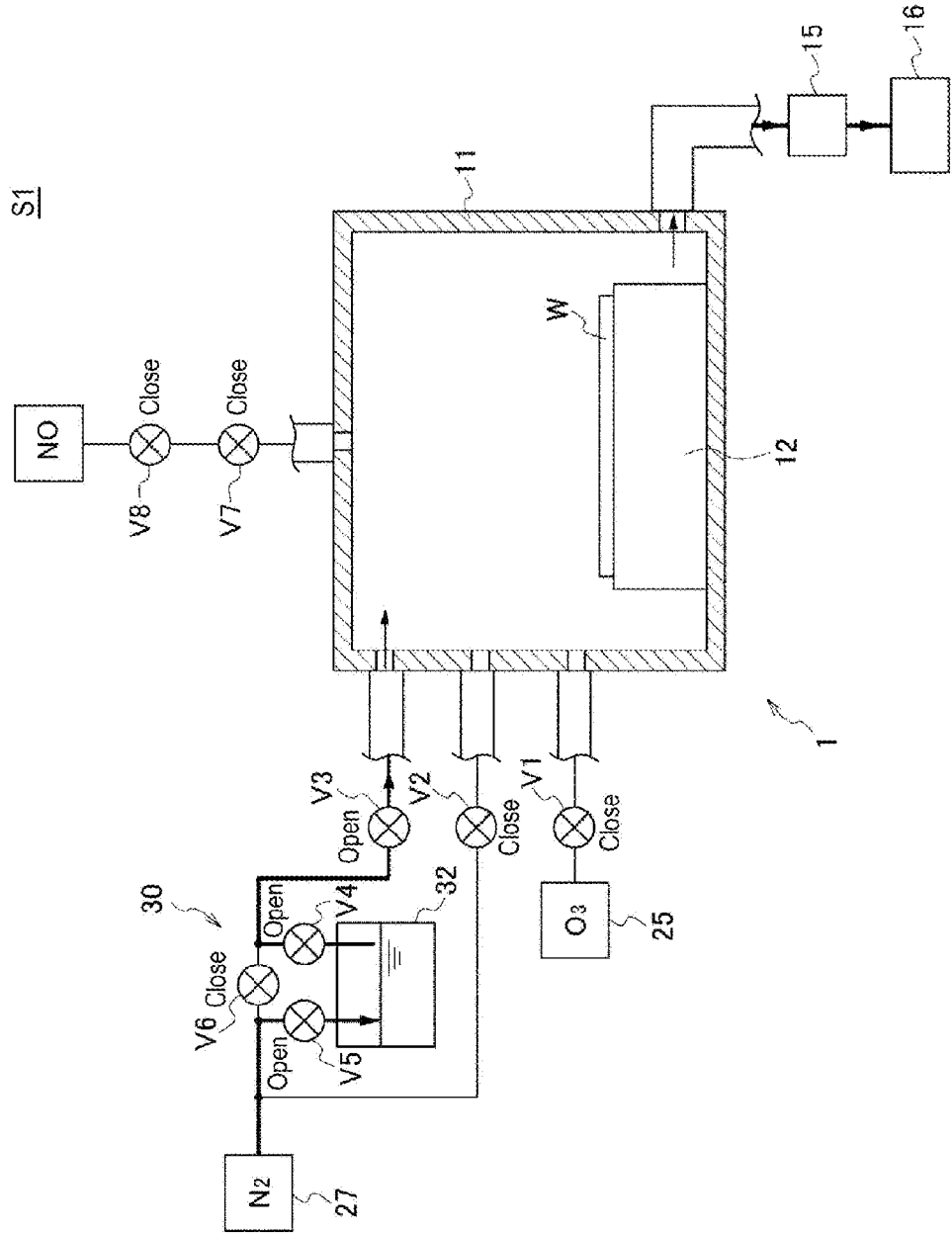
FIGS. 3 to 9 are process views illustrating a film forming process performed by the film forming apparatus.
Figure 4:
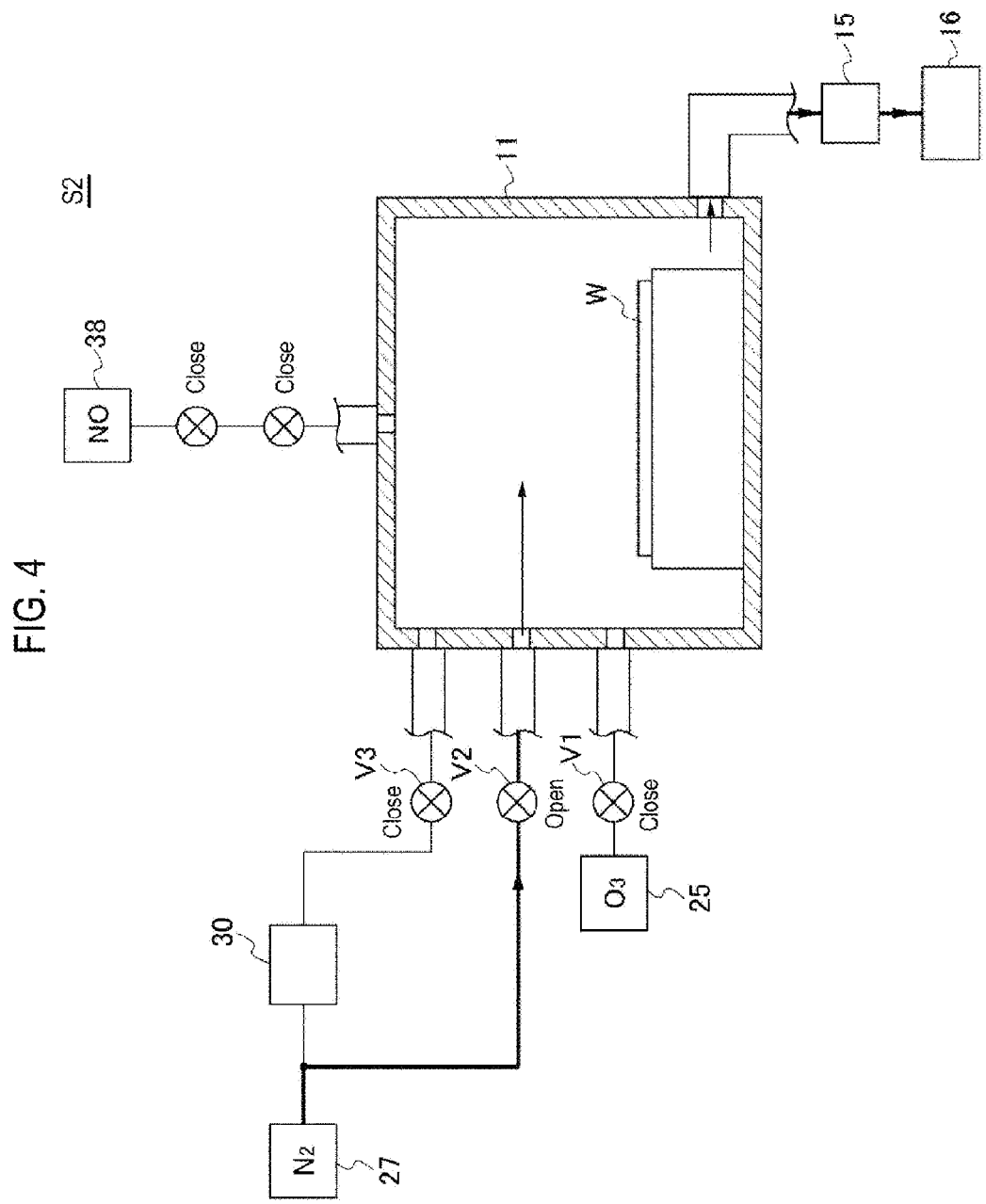
Figure 5:
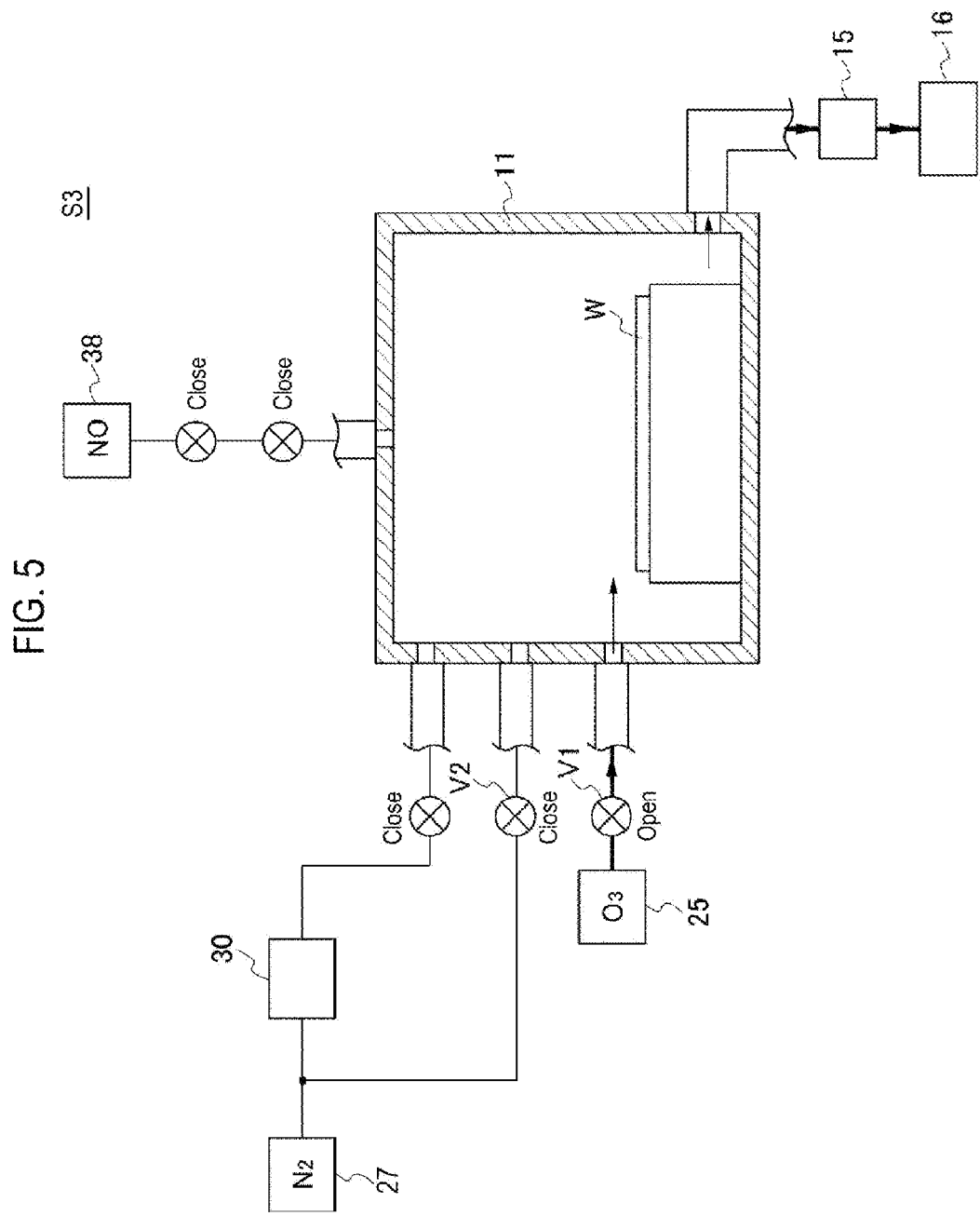

Specifically, as will be described later, in this embodiment, the NO gas is supplied in a state in which an ozone atmosphere is formed in the vacuum vessel 11 into which a wafer W is loaded, thereby decomposing ozone. The decomposition is a chain decomposition reaction forcibly caused so that ozone is decomposed by NO to generate active species such as radicals of oxygen and the active species decomposes ozone nearby to further generate active species of oxygen. In the graph of FIG. 2, the vertical axis and the horizontal axis are set to a pressure (unit: Torr) and an ozone concentration (unit: Vol %) in an atmosphere, respectively. Each plot on the graph represents a pressure and an ozone concentration, where it is verified that the chain decomposition reaction has actually occurred by an experiment. The line of the graph represents limits of the pressure and the ozone concentration where the chain decomposition reaction obtained from each plot occurs, i.e., initiation limits. As will be described later, when the NO gas is supplied into the vacuum vessel 11 when the oxidation is performed on the wafer W, the interior of the vacuum vessel 11 obtains a pressure not less than the pressure limit shown in the graph and an ozone concentration not less than the ozone concentration limit shown in the graph.

Continuously, an operation of the film forming apparatus 1 will be described with reference to FIGS. 3 to 9 which illustrate opening/closing states of the respective valves. In FIGS. 3 to 9, the flow of each gas is also indicated by an arrow. A wafer W is loaded into the vacuum vessel 11 through a transfer port (not shown) and is mounted on the stage 12. The vacuum vessel 11 is vacuumized in a state in which the respective valves V1 to V8 are closed, and the interior of the vacuum vessel 11 is then adjusted to a vacuum atmosphere of a predetermined pressure. Subsequently, the valve V6 is opened, and the pressure of a flow path at an upstream side of the valve V6 is adjusted. Next, the valve V6 is closed, and simultaneously, the valves V3, V4 and V5 are opened, so that the $N_2$ gas is supplied into the liquid source tank 32 of the source supply unit 30 from the $N_2$ gas supply source 27. By the $N_2$ gas, aminosilane in the liquid source tank 32 is vaporized, and a film forming source gas consisting of the aminosilane and the $N_2$ gas is supplied into the vacuum vessel 11. Thus, molecules of the aminosilane are adsorbed onto a surface of the wafer W, thereby forming a molecular layer of the aminosilane (Step S1, FIG. 3).

The valves V3, V4 and V5 are closed, and the supply of the film forming source gas into the vacuum vessel 11 is stopped. Thereafter, the valve V2 is opened so that the $N_2$ gas is supplied into the vacuum vessel 11. By the $N_2$ gas, surplus aminosilane not adsorbed onto the wafer W in the vacuum vessel 11 is purged, thereby being removed from the interior of the vacuum vessel 11 (Step S2, FIG. 4).

Subsequently, the valve V2 is closed, and simultaneously, the valve V1 is opened. Then, the $O_3$ gas is supplied into the vacuum vessel 11, so that the ozone pressure in the vacuum vessel 11 increases (Step S3, FIG. 5). Thereafter, the exhaust by the exhaust flow rate adjustment unit 15 is stopped once, and the valve V1 is closed, so that the vacuum vessel 11 is sealably filled with the $O_3$ gas. At this time, although the ozone diluted as NO gas is supplied into the vacuum vessel 11 in a subsequent step, the ozone concentration in the vacuum vessel 11 is maintained at not less than the ozone concentration limit at which the chain deposition reaction as described in FIG. 2 can occur. In this example, the pressure of the vacuum vessel 11 becomes 30 Torr (4.0×10³Pa) when the ozone is sealably filled. Therefore, from the graph of FIG. 2, the ozone concentration of the vacuum vessel 11 exceeds 30 Vol %.

Figure 6:
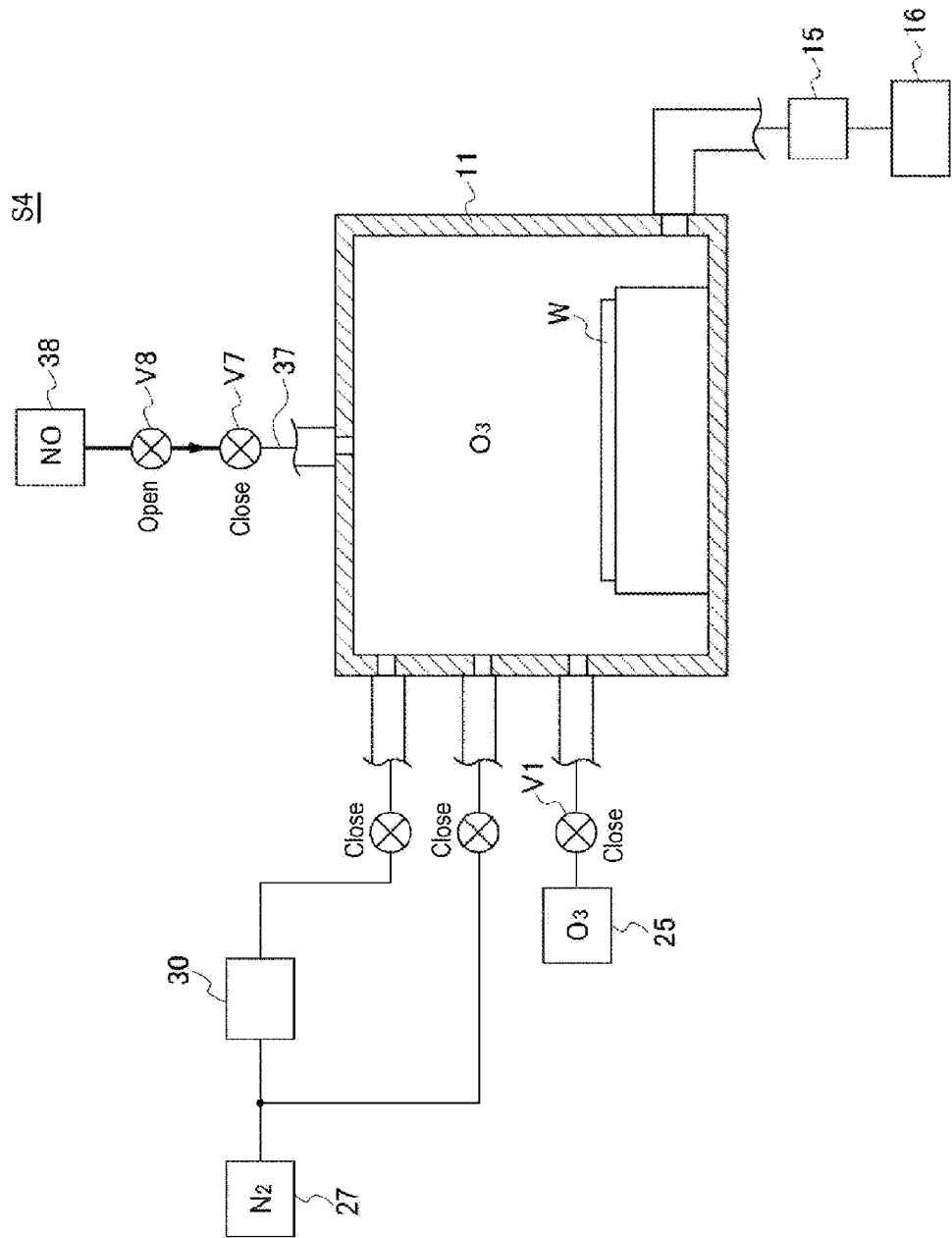
Figure 7:
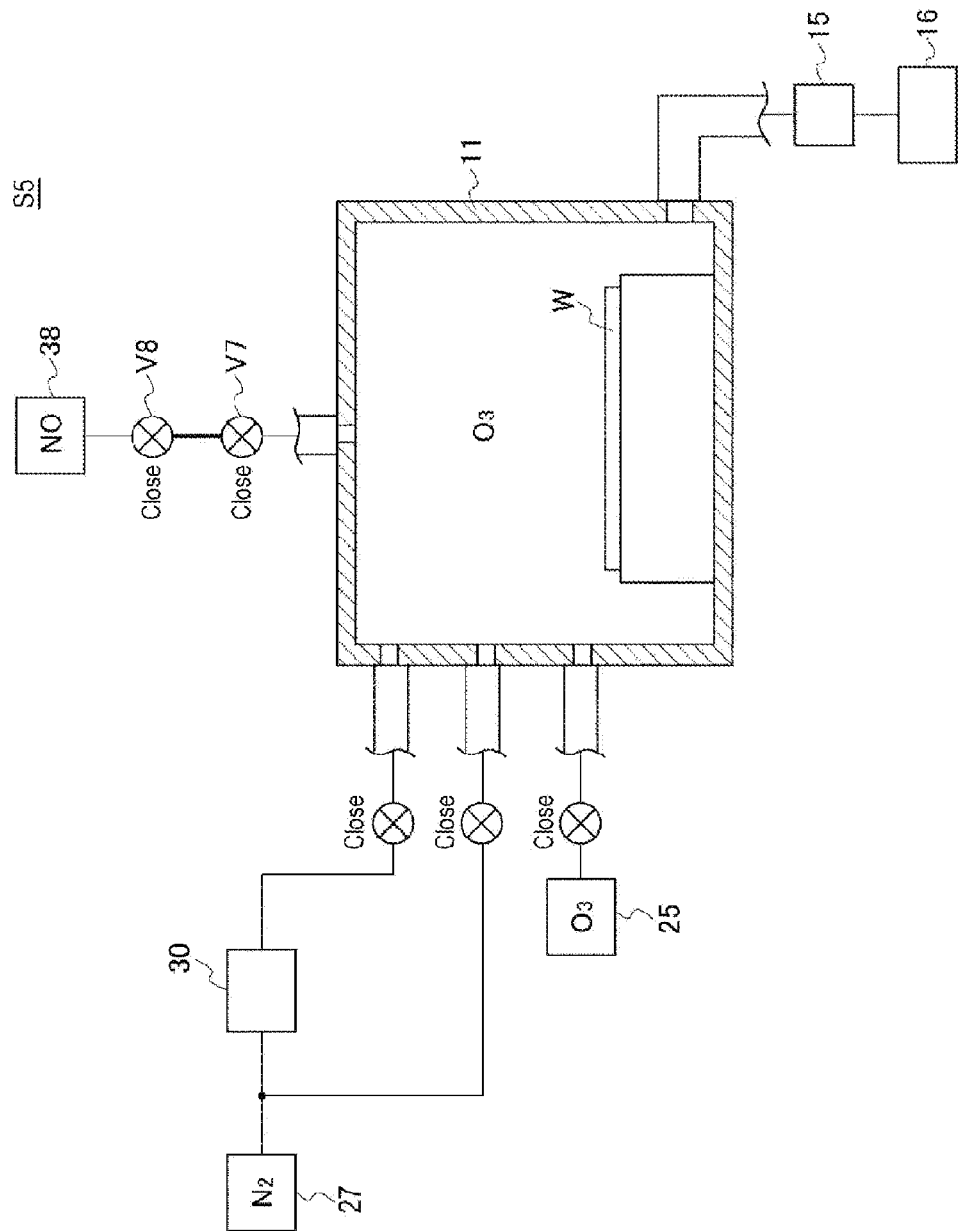
Figure 8:
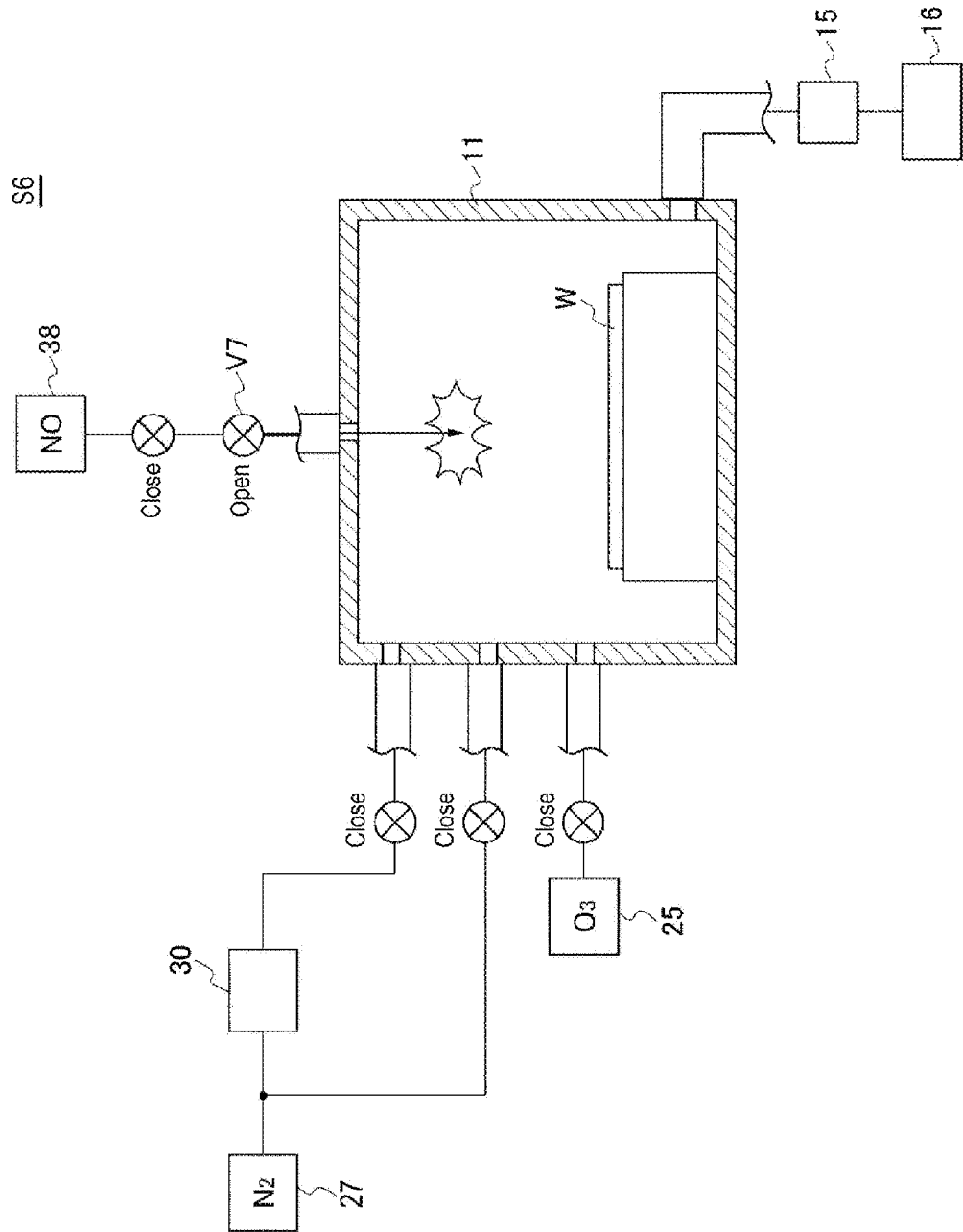
Figure 9:
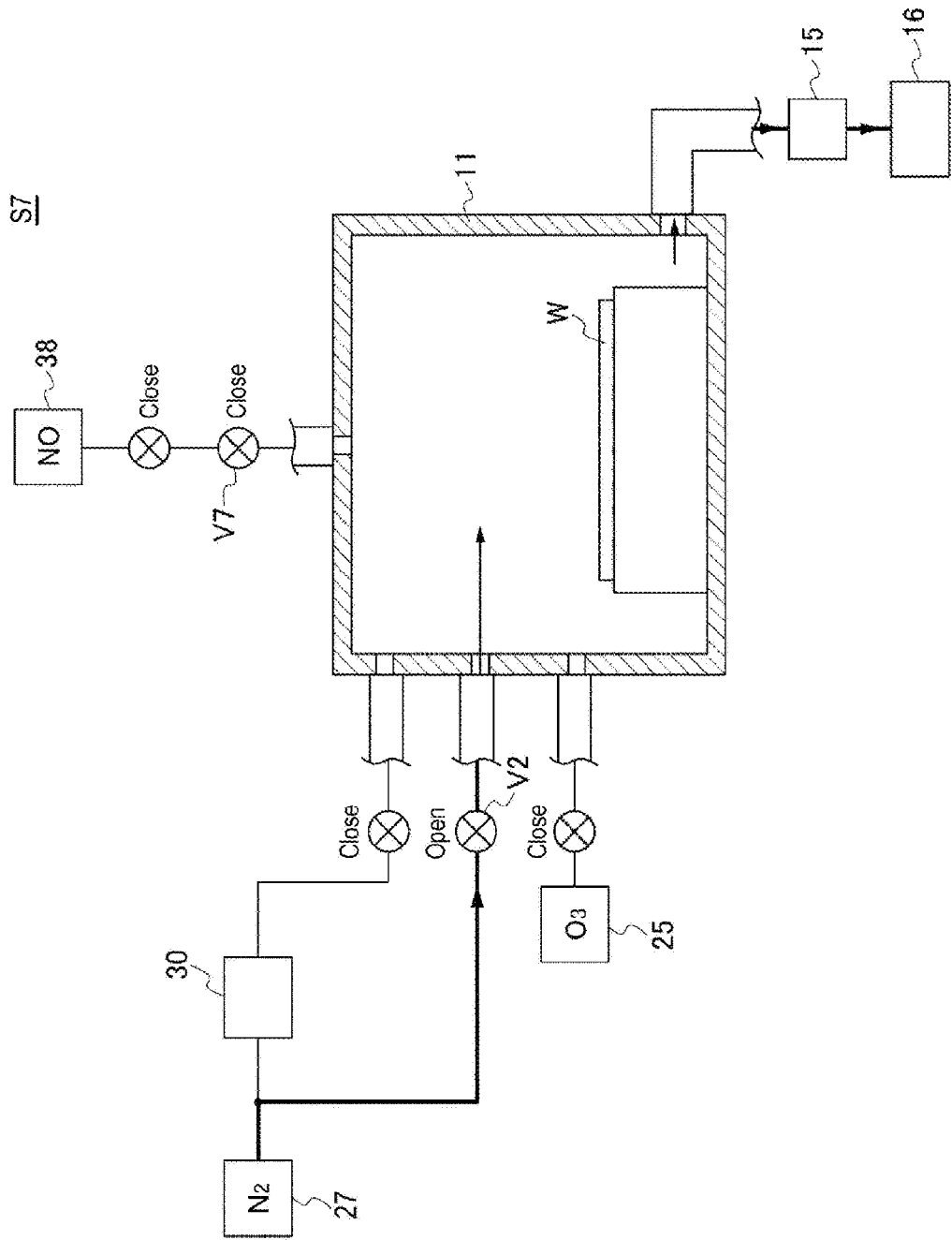

When the ozone is sealably filled, the valve V8 is opened, and the NO gas is stored at an upstream side of the valve V7 of the pipe 37 (Step S4, FIG. 6). Thereafter, the valve V8 is closed (Step S5, FIG. 7), and the portion between the valves V7 and V8 of the pipe 37 has a pressure higher than that of the interior of the vacuum vessel 11. The differential in pressure between the interior of the vacuum vessel 11 and the portion between the valves V7 and V8 of the pipe 37 is formed as described above, so that the NO gas is surely supplied into the vacuum vessel 11, thereby generating the above-described chain decomposition reaction of $O_3$. In some embodiments, the differential pressure is set to not less than 10 Torr ($1.3 \times 10^3$ Pa), and a differential pressure of 30 Torr ($4.0 \times 10^3$ Pa) is formed in this example. That is, the pressure of the portion between the valves V7 and V8 of the pipe 37 becomes 60 Torr ($8.0 \times 10^3$ Pa).

Thereafter, the valve V7 is opened. As the differential pressure is formed as described above, the NO gas rapidly flows toward the interior of the vacuum vessel 11 to be brought into contact with the ozone in the vacuum vessel 11. Therefore, the ozone is forcibly decomposed as already described. Thus, the generated active species of oxygen react with the molecular layer of the aminosilane adsorbed onto the surface of the wafer W and the aminosilane is oxidized, thereby forming a molecular layer of silicon oxide (Step S6, FIG. 8).

Since the active species are unstable, the active species are changed into oxygen after, for example, few milliseconds elapse from the generation of the active species, and the oxidation is terminated. Thereafter, the valve V7 is closed, and the interior of the vacuum vessel 11 is exhausted at a predetermined flow rate by the exhaust flow rate adjustment unit 15. Also, the valve V2 is opened so that $N_2$ gas is supplied into the vacuum vessel 11. The oxygen remaining in the vacuum vessel 11 is purged by the $N_2$ gas, thereby being removed from the interior of the vacuum vessel 11 (Step S7, FIG. 9).

Figure 10:
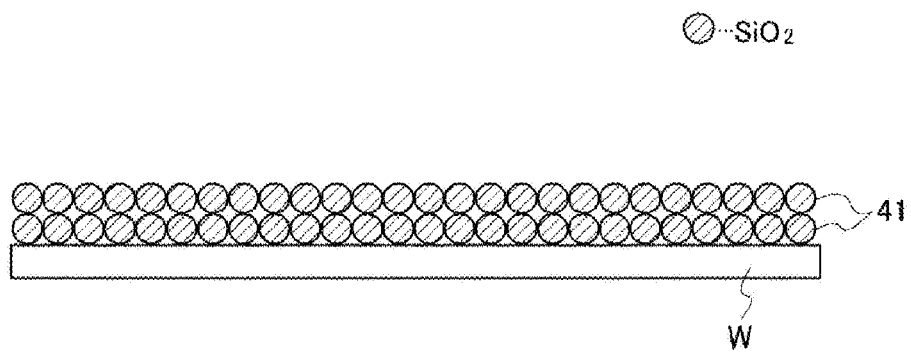
FIGS. 10 to 15 are schematic views illustrating a state of a wafer in the film forming process.
Figure 11:
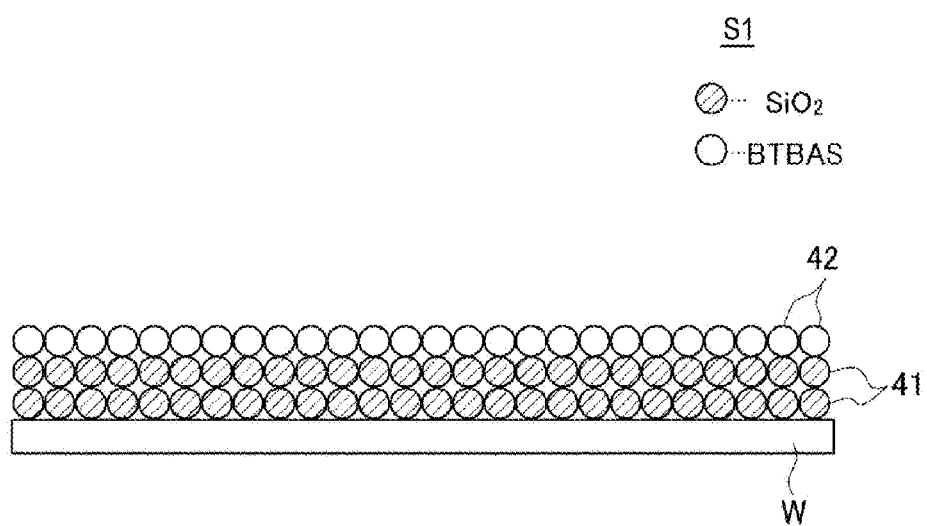
Figure 12:
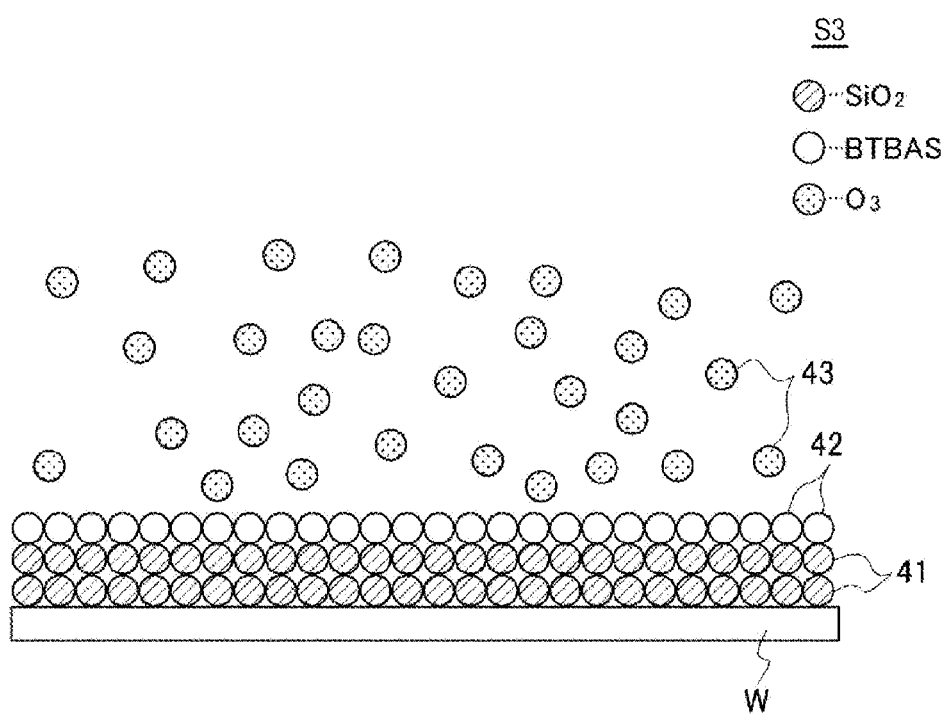

If Steps S1 to S7 are set as one cycle, the cycle is repeated a plurality of times, so that one molecular layer of silicon oxide is laminated on the wafer W whenever the cycle is performed once. A change in state of the surface of the wafer W when the cycle after the second time is performed will be described with reference to schematic views of FIGS. 10 to 15. FIG. 10 illustrates a state just before a certain cycle starts. FIG. 11 illustrates a state in which Step S1 of the cycle is performed and molecules 42 of aminosilane (BTBAS) are then adsorbed onto the surface of the wafer W. In each figure, reference numeral 41 designates molecules of silicon oxide already formed on the wafer W. FIG. 12 illustrates a state in which ozone gas is supplied into the vacuum vessel 11 in Step S3 of the same cycle, and reference numeral 43 designates molecules of ozone.

Figure 13:
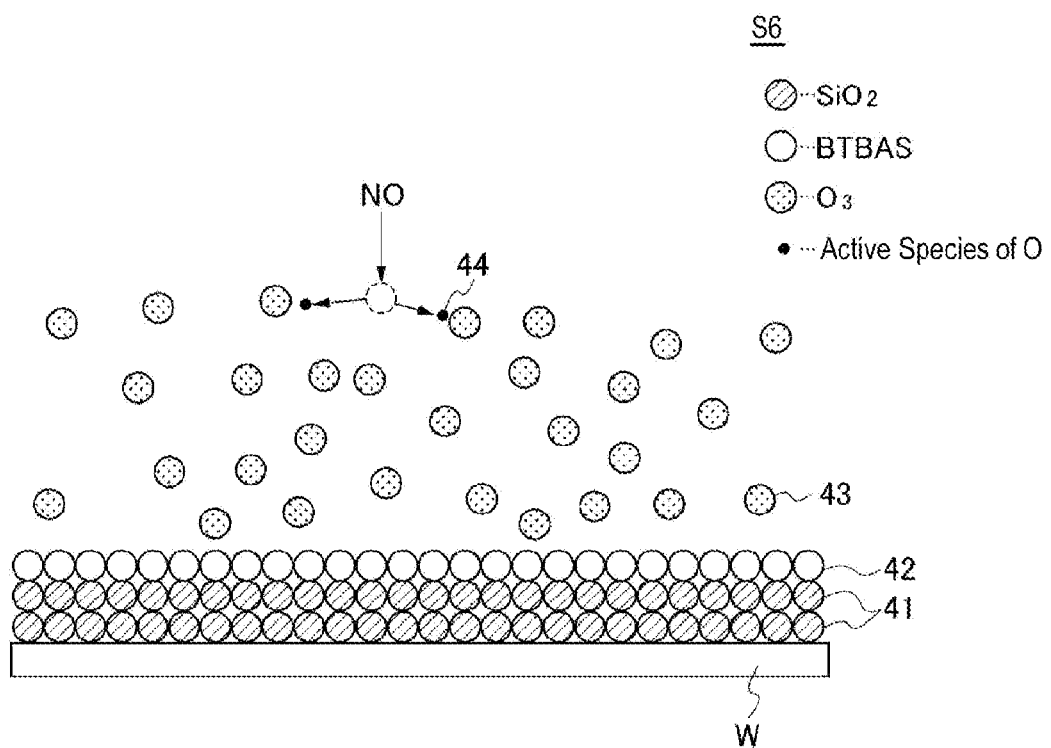
Figure 14:
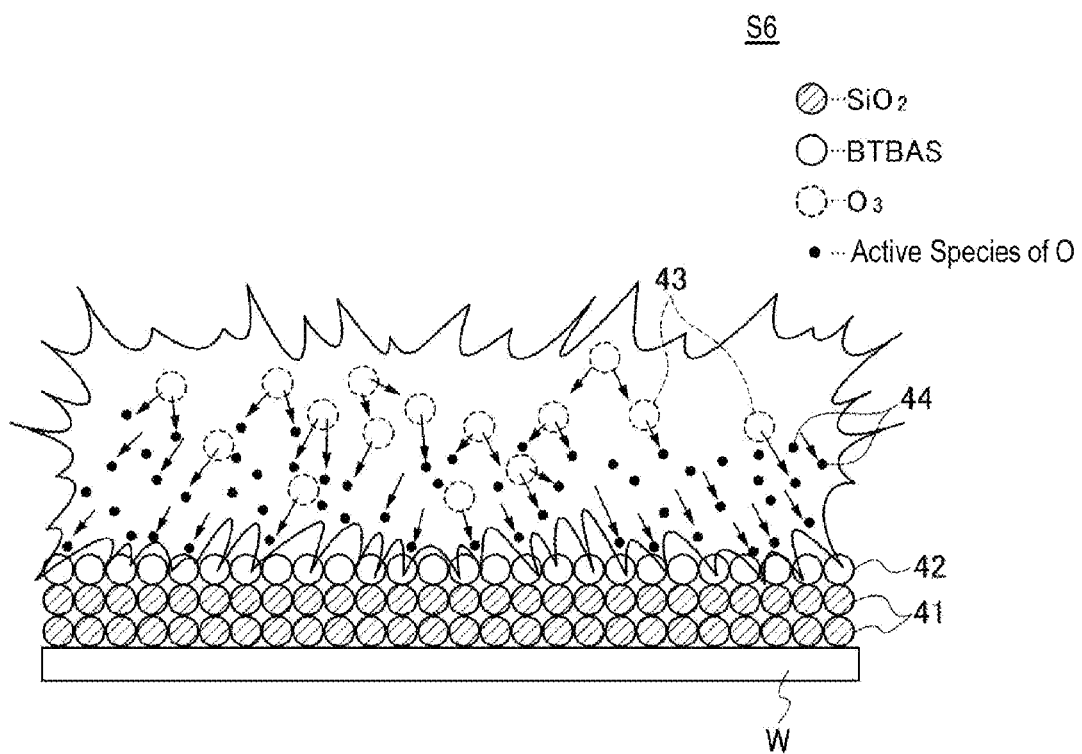

FIG. 13 illustrates a moment at which NO gas is supplied into the vacuum vessel 11 in subsequent Step S6. As described above, NO and ozone cause a chemical reaction to provide energy to the ozone, and the ozone is forcibly decomposed to generate active species 44 of oxygen. Then, the ozone is forcibly decomposed by the active species 44, and the ozone is further decomposed by the active species 44 generated. The ozone is chain-decomposed as described above, so that the ozone in the vacuum vessel 11 is instantaneously changed into the active species 44 (FIG. 14).

Figure 15:
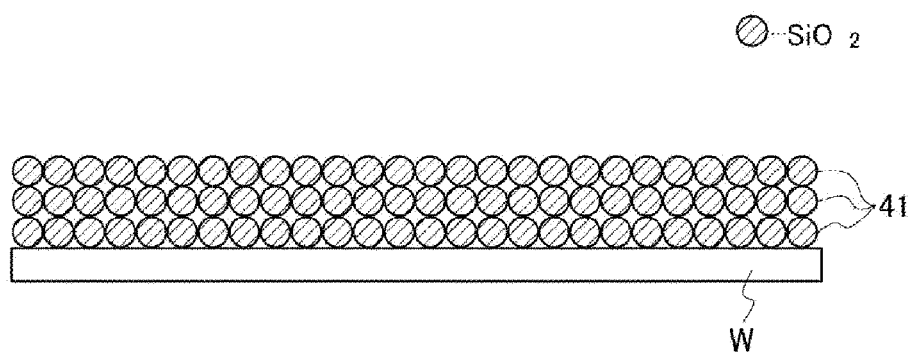

The energy of heat and light emitted through the chain decomposition reaction is applied to the molecules 42 of the aminosilane exposed to the space in which the chain decomposition reaction of the ozone occurs. Thus, the energy of the molecules 42 instantaneously increases, thereby increasing the temperature of the molecules 42. The active species 44 reactable with the molecules 42 are present around the molecules 42 of the aminosilane activated by the increased temperature as described above. Therefore, a reaction between the molecules 42 and the active species 44 of the oxygen occurs. That is, the molecules 42 of the aminosilane are oxidized, so that molecules 41 of silicon oxide are generated (FIG. 15).

The molecules of the aminosilane receive the energy generated by the chain decomposition reaction of the ozone as described above. Thus, the oxidation of the aminosilane can be performed without heating the wafer W by the heater as described in the BACKGROUND section. The state in which the molecules 42 of the aminosilane are oxidized has been described in Steps S1 to S7 of the cycle after the second cycle. However, similarly, in Steps S1 to S7 of the first cycle, the energy generated by the decomposition of ozone is applied to molecules 42 of aminosilane, so that the molecules 42 are oxidized. If a silicon oxide film of a desired thickness is formed by repeatedly performing the cycle a predetermined number of times, the wafer W is unloaded from the interior of the vacuum vessel 11.

According to the film forming method performed by the film forming apparatus 1, an ozone atmosphere having a relatively high concentration is formed in the vacuum vessel 11 as already described, and the ozone is chain decomposed at room temperature by NO gas. Further, the aminosilane on the surface of the wafer W is oxidized by the active species generated due to the chain decomposition, thereby forming the oxide film. As shown in the following evaluation test, the oxide film formed as described above has the same film quality as an oxide film formed by heating the wafer W. Thus, in the film forming method, it is unnecessary to provide a heater or the like for heating the wafer W in order to perform oxidation, thereby promoting reduction in manufacturing cost or operating cost of the film forming apparatus 1. Further, the oxidation of aminosilane can be performed without waiting for the heater to heat the wafer W to a predetermined temperature. Accordingly, it is possible to reduce the time required to perform the film forming process, thereby improving throughput.

In the film forming apparatus 1, the gas supply port 36 of the NO gas is provided opposite to the surface of the wafer W mounted on the stage 12. The decomposition reaction of ozone progresses instantaneously, as already described. In this state, the gas supply port 36 is opened, so that the decomposition reaction is propagated toward the bottom from the top in the vacuum vessel 11 during the instantaneous time. As the reaction is propagated as described above, the wafer W receives a force toward the bottom and is pressed against the stage 12. Thus, the oxidation already described is performed in the state in which the wafer W is fixed to the stage 12. That is, it is possible to prevent the wafer W from being separated from the stage 12 by a change in pressure in the vacuum vessel 11 due to the forcible decomposition of the ozone.

In Step S5, when the differential pressure between the portion between the valves V7 and V8 of the pipe 37 and the interior of the vacuum vessel 11 is formed, the portion between the valves V7 and V8 may have a pressure lower than that of the interior of the vacuum vessel 11. In this case, if the valve V7 is opened in Step S4, the ozone gas in the vacuum vessel 11 flows into the pipe 37 to be in contact with the NO gas, thereby initiating a chain decomposition reaction in the pipe 37. The decomposition reaction is propagated to the vacuum vessel 11, so that the aminosilane on the surface of the wafer W is oxidized. In this case, the pipe 37 is configured to endure the heat and pressure generated in the decomposition reaction.

In the above-described example, the chain decomposition reaction already described is initiated by supplying energy to the ozone through the chemical reaction between the NO and the ozone. However, the present disclosure is not limited to providing the chemical reaction, as long as energy can be supplied to initiate the chain decomposition reaction. For example, the film forming apparatus 1 may be configured to irradiate the interior of the vacuum vessel 11 with laser light, and the chain decomposition reaction may be initiated by supplying energy to the ozone through the irradiation with the laser light. Also, the film forming apparatus 1 may be configured so that electrodes are provided in the vacuum vessel 11, and a voltage is applied to the electrodes, thereby causing electric discharge. The chain decomposition reaction may be initiated by providing the energy of the electric discharge. However, in some cases, the chain decomposition reaction is caused by causing the chemical reaction described above, in terms of simplifying configuration of the apparatus and preventing a metal constituting the electrodes for electric discharge from being scattered on the wafer W. In addition to the NO gas, a gas causing a rapid reaction with the ozone gas may be used in order to cause the chemical reaction.

For example, in the above-described film forming apparatus 1, the NO gas may be supplied into the vacuum vessel 11 in a state in which the vacuum vessel 11 is sealably filled with ammonia gas, methane gas, diborane gas, or the like, together with the ozone gas. When $O_3$ is decomposed, these gases may also be decomposed to chemically react with the aminosilane, thereby forming silicon oxide films doped with elements constituting these gases, respectively. Specifically, the vacuum vessel 11 may be sealably filled with the ammonia gas, the methane gas and the diborane gas, thereby forming silicon oxide films doped with N (nitrogen), C (carbon) and B (boron), respectively.

The source gas applied to the embodiment is not limited to that for forming the silicon oxide film as described above. For example, an aluminum oxide film, a hafnium oxide film, a strontium oxide film, a titanium oxide film, or the like may be formed using TMA [tri-methyl-aluminum], TEMHF [tetrakis-ethyl-methyl-amino-hafnium], $Sr(THD)_2$ [strontium bis-tetramethylheptanedionate], Ti(MPD)(THD) [titanium (methyPpentanedionato bis-tetramethylheptanedionato], or the like, respectively.

<Evaluation Test>

An evaluation test performed according to the present disclosure will be described. As Evaluation Test 1, a silicon oxide film was formed on a wafer W by the method described in FIGS. 3 to 15, using the film forming apparatus 1. Then, an etching rate was measured after wet-etching the formed silicon oxide film. In Evaluation Test 1, an etching rate at one end of the wafer W and an etching rate at the other end thereof were measured.

As Comparison Test 1-1, a silicon oxide film was formed on a wafer W, using a film forming apparatus for enabling oxygen gas to be converted into a plasma state in a vacuum vessel. More specifically, like the film forming apparatus 1, in this film forming apparatus, a film forming source gas can be supplied into the vacuum vessel 11, and simultaneously, oxygen supplied into the vacuum vessel 11 can be converted into a plasma state. The film can be formed by alternately performing the supply of the film forming source gas and the oxidation of the source by the conversion of the oxygen into the plasma state. In Comparison Test 1-1, the oxidation was performed at room temperature in the same manner as Evaluation Test 1. After the film formation, an etching rate was measured after wet-etching the silicon oxide film in the same manner as Evaluation Test 1.

As Comparison Test 1-2, a silicon oxide film was formed on a wafer W in a vacuum vessel by alternately and repeatedly supplying the film forming source gas and ozone gas to the wafer W while heating the wafer W to a predetermined temperature by a heater. That is, in Comparison Test 1-2, thermal energy is provided to the wafer W by heating the wafer W without performing the chain decomposition reaction of ozone, so that aminosilane adsorbed onto the wafer W is oxidized by the ozone. After the film formation, an etching rate was measured in the same manner as the other tests.

Figure 16:
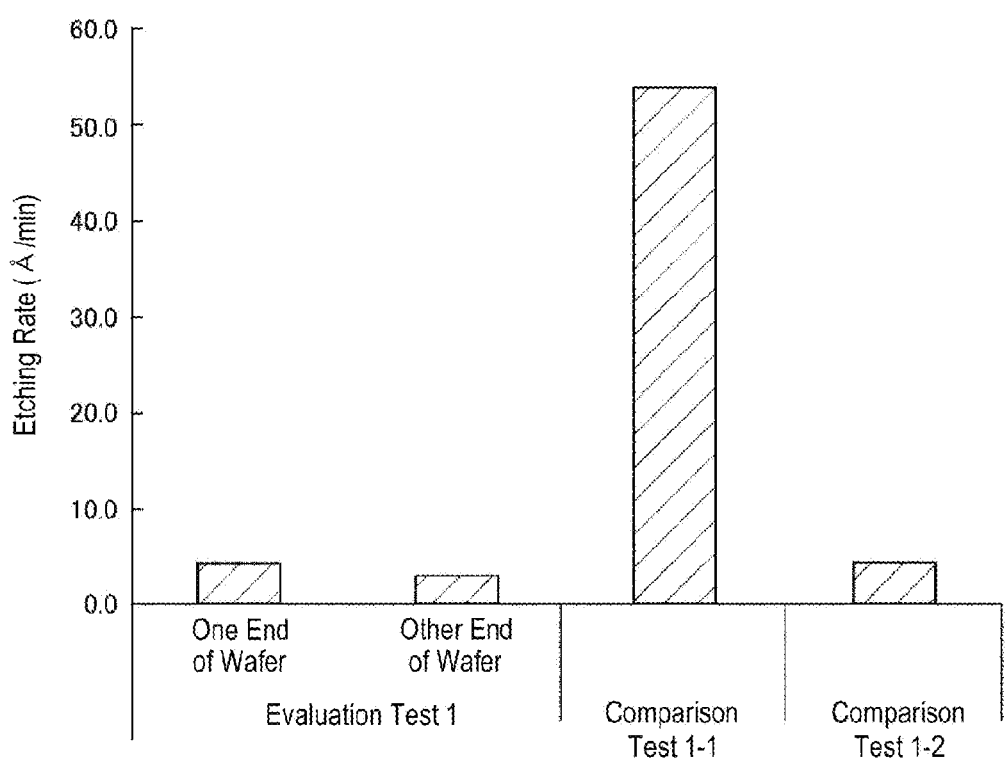
FIGS. 16 and 17 are graphs illustrating a result of an evaluation test.

FIG. 16 is a graph illustrating measurement results of etching rates in Evaluation Test 1 and Comparison Tests 1-1 and 1-2, wherein the vertical axis represents the etching rates (unit: Å/min) As shown in the graph, for the wafer W in Evaluation Test 1, the etching rate at the one end was 4.8 Å/min and the etching rate at the other end was 3.4 Å/min, which are approximately similar. Also, the etching rate in Comparison Test 1-1 was 54.2 Å/min, and the etching rate in Comparison Test 1-2 was 4.7 Å/min. That is, the etching rate in Evaluation Test 1 is controlled clearly lower than that in Comparison Test 1-1 in which the processing is performed at the same room temperature. The etching rate in Evaluation Test 1 is approximately equal to that in Comparison Test 1-2 in which the heating is performed by the heater in order to perform the oxidation. That is, in Evaluation Test 1, the silicon oxide film having a film quality approximately equal to that of the silicon oxide film formed by performing the heating in the film formation was formed. Thus, from the result of the evaluation test, as described in the embodiment, the method of the present disclosure is used, so that a silicon oxide film having an excellent film quality can be formed without performing the heating by a heater.

Continuously, Evaluation Test 2 in which the thermal history of a silicon oxide film formed by performing the processing according to the embodiment will be described. In Evaluation Test 2, P (phosphorus) was injected into each of a plurality of substrates made of silicon by ion implantation. The ion implantation was performed at 2 keV and 1E15 ions/cm². Then, the film forming apparatus 1 was used to form a silicon oxide film on the substrate into which the P was injected. In the formation of the silicon oxide film, the cycle was performed 100 times. In Step S3 of each cycle, the ozone gas was supplied so that an ozone concentration in the vacuum vessel 11 was 77.7 Vol %. After the silicon oxide film was formed, a resistance value of the silicon oxide film was measured. Further, among substrates having the P being injected, heating processes were performed at different temperatures for five minutes on the substrates as references where the silicon oxide film was not formed. After the heating process was performed, resistance valves of these references were measured.

Figure 17:
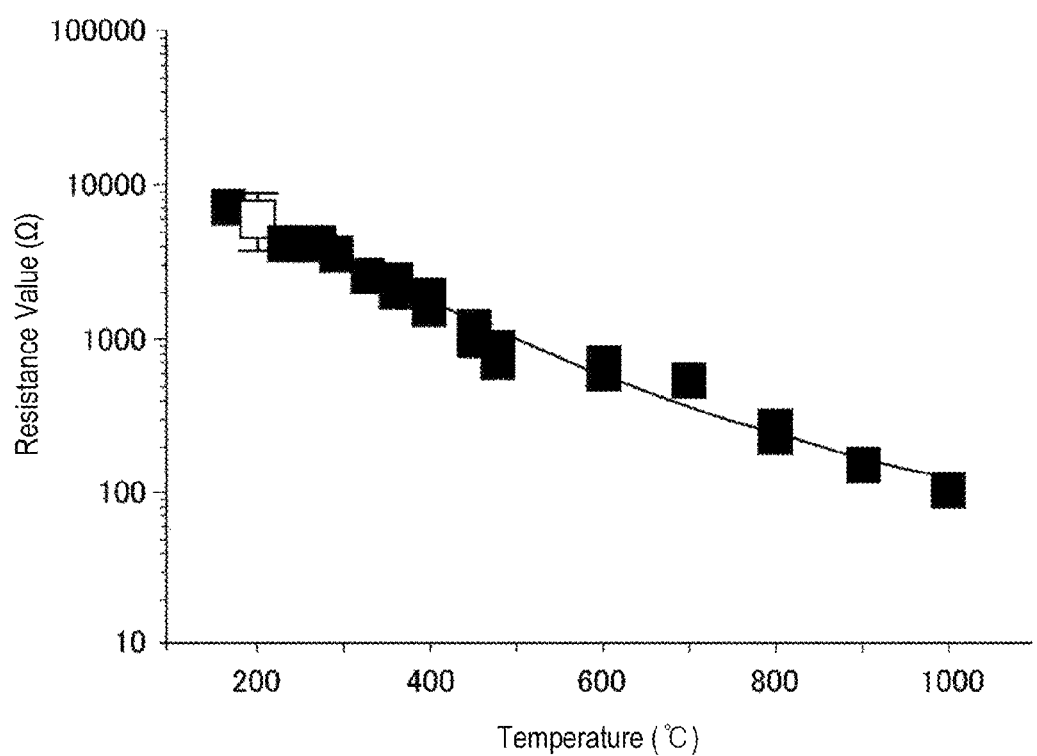

FIG. 17 is a graph illustrating a result of Evaluation Test 2. The plot indicated by black color is a resistance value of each reference, and the plot indicated by white color is a resistance value of the silicon oxide film formed in the film forming apparatus 1. As shown in the graph, the resistance value of the silicon oxide film corresponds to that of the reference heated at 200 degrees C. That is, performing the cycle described in the embodiment for 100 times corresponds to applying heat of 200 degrees C. to the substrate for five minutes. That is, as the heat is applied to the substrate by the chain decomposition reaction, the heat is applied as described in the embodiment. Therefore, as described above, it is possible to perform the oxidation of the aminosilane without heating the substrate by the heater or the like.

According to the present disclosure, an ozone atmosphere where a chain decomposition reaction can be caused is formed in the vacuum vessel. Also, a source adsorbed onto a substrate is oxidized using active species of oxygen generated by the chain decomposition reaction. A relatively large energy is applied to a surface of the substrate by the chain decomposition reaction for a very short time, so that the active species and the source react with each other. Thus, the oxidation is sufficiently performed without heating the substrate by a heating mechanism such as a heater, thereby obtaining an oxide film having excellent properties.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for obtaining a thin film by laminating molecular layers of oxide on a surface of a substrate in a vacuum atmosphere, the method comprising performing a cycle a plurality of times, the cycle including:
   supplying a source gas containing a source to the substrate in a vacuum vessel to adsorb the source onto the substrate;
   forming an ozone atmosphere containing ozone having a concentration (Vol %) not less than that where a chain decomposition reaction is caused in the vacuum vessel; and
   forcibly decomposing the ozone by supplying energy to the ozone atmosphere to generate active species of oxygen, and oxidizing the source adsorbed onto the surface of the substrate by the active species to obtain the oxide,
   wherein oxidizing the source comprises supplying a reaction gas for causing the forcible decomposition by chemically reacting with the ozone to the ozone atmosphere, and
   wherein the reaction gas is nitrogen monoxide.

2. The method of claim 1, wherein forming an ozone atmosphere comprises sealably filling the vacuum vessel storing the substrate with ozone gas.

3. A film forming method for obtaining a thin film by laminating molecular layers of oxide on a surface of a substrate in a vacuum atmosphere, the method comprising performing a cycle a plurality of times, the cycle including:
   supplying a source gas containing a source to the substrate in a vacuum vessel to adsorb the source onto the substrate;
   forming an ozone atmosphere containing ozone having a concentration (Vol %) not less than that where a chain decomposition reaction is caused in the vacuum vessel; and
   forcibly decomposing the ozone by supplying energy to the ozone atmosphere to generate active species of oxygen, and oxidizing the source adsorbed onto the surface of the substrate by the active species to obtain the oxide,
   wherein oxidizing the source comprises supplying a reaction gas for causing the forcible decomposition by chemically reacting with the ozone to the ozone atmosphere, and
   wherein supplying the reaction gas comprises:
   supplying the reaction gas to a storage portion of the reaction gas partitioned from the vacuum vessel having the ozone atmosphere formed so that a differential pressure is formed between the storage portion and the vacuum vessel; and
   bringing the reaction gas and the ozone into contact with each other by allowing the vacuum vessel and the storage portion to be in communication with each other.

4. A film forming method for obtaining a thin film by laminating molecular layers of oxide on a surface of a substrate in a vacuum atmosphere, the method comprising performing a cycle a plurality of times, the cycle including:
   supplying a source gas containing a source to the substrate in a vacuum vessel to adsorb the source onto the substrate;
   forming an ozone atmosphere containing ozone having a concentration (Vol %) not less than that where a chain decomposition reaction is caused in the vacuum vessel; and
   forcibly decomposing the ozone by supplying energy to the ozone atmosphere to generate active species of oxygen, and oxidizing the source adsorbed onto the surface of the substrate by the active species to obtain the oxide,
   wherein oxidizing the source comprises supplying a reaction gas for causing the forcible decomposition by chemically reacting with the ozone to the ozone atmosphere, and
   wherein supplying the reaction gas comprises supplying the reaction gas into the vacuum vessel from a supply port which is formed in the vacuum vessel and opposite to the substrate.

* * * * *